(12) United States Patent
Fuchter et al.

(10) Patent No.: US 9,902,903 B2
(45) Date of Patent: Feb. 27, 2018

(54) ELECTROLUMINESCENT COMPOSITIONS

(71) Applicant: Imperial Innovations Limited, London (GB)

(72) Inventors: Matthew Fuchter, London (GB); Alasdair Campbell, London (GB); Ying Yang, London (GB)

(73) Assignee: IMPERIAL INNOVATIONS LIMITED, London (GB)

( * ) Notice: Subject to any disclaimer, the term of this patent is extended or adjusted under 35 U.S.C. 154(b) by 405 days.

(21) Appl. No.: 14/416,755

(22) PCT Filed: Jul. 26, 2013

(86) PCT No.: PCT/GB2013/052007
§ 371 (c)(1),
(2) Date: Jan. 23, 2015

(87) PCT Pub. No.: WO2014/016611
PCT Pub. Date: Jan. 30, 2014

(65) Prior Publication Data
US 2015/0184068 A1 Jul. 2, 2015

(30) Foreign Application Priority Data
Jul. 27, 2012 (GB) .................................. 1213392.2

(51) Int. Cl.
| | | |
|---|---|---|
| A01N 43/42 | (2006.01) |
| A61K 31/44 | (2006.01) |
| C09K 11/06 | (2006.01) |
| H05B 33/14 | (2006.01) |
| H01L 51/00 | (2006.01) |
| H01L 51/50 | (2006.01) |
| H01L 51/52 | (2006.01) |
| H01L 51/56 | (2006.01) |

(52) U.S. Cl.
CPC .......... *C09K 11/06* (2013.01); *H01L 51/0056* (2013.01); *H01L 51/0058* (2013.01); *H01L 51/0071* (2013.01); *H01L 51/0072* (2013.01); *H05B 33/14* (2013.01); *C09K 2211/1011* (2013.01); *C09K 2211/1029* (2013.01); *C09K 2211/14* (2013.01); *C09K 2211/1425* (2013.01); *C09K 2211/1466* (2013.01); *C09K 2211/1483* (2013.01); *H01L 51/0002* (2013.01); *H01L 51/5012* (2013.01); *H01L 51/5296* (2013.01); *H01L 51/56* (2013.01); *H01L 2251/558* (2013.01)

(58) Field of Classification Search
None
See application file for complete search history.

(56) References Cited

FOREIGN PATENT DOCUMENTS

| | | |
|---|---|---|
| JP | 2000-195673 | 7/2000 |
| WO | 2003/051092 | 6/2003 |
| WO | 2004/003108 | 1/2004 |

OTHER PUBLICATIONS

Chen, S. H. et al., "Circularly polarized light generated by photoexcitation of luminophores in glassy liquid-crystal films", Nature, vol. 397, Feb. 11, 1991, pp. 506-508.
El Abed, Riadh et al., "An Alternative Procedure for the Synthesis of [5]- and [7]Carbohelicenes", Eur. J. Org. Chem., 2004, pp. 1517-1522.
Field, Jason E. et al., "Circularly Polarized Luminescence from Bridged Triarylamine Helicenes", Journal of American Chemical Society, vol. 125, No. 39, 2003, p. 11808-11809.
Grell, Martin et al., "A Compact Device for the Efficient, Electrically Driven Generation of Highly Circularly Polarized Light", Advanced Materials, vol. 13, No. 8, Apr. 18, 2001, p. 577-580.
Grell, Martin et al., "Blue Polarized Electroluminescence from a Liquid Crystalline Polyflourene", Advanced Materials, vol. 11, No. 8, 1999, p. 671-675.
Grell, Martin et al., "Polarized Luminescence from Oriented Molecular Materials", Advanced Materials, vol. 11, No. 11, 1999, pp. 895-905.
Jeong, Soon Moon et al., "Highly circularly polarized electroluminescence from organic light-emitting diodes with wideband reflective polymeric cholesteric liquid crystal films", American Institute of Physiscs, Applied Physics Letters, vol. 90, 2007, p. 211106-1-211106-3.
Katsis, D. et al., "Circularly Polarized Photoluminescence from Gradient-Pitch Chiral-Nematic Films", Chem. Mater., vol. 13, No. 2, 2001, pp. 643-647.
Peeters, Emiel et al., "Circularly Polarized Electroluminescence from a Polymer Light-Emitting Diode", Journal of American Chemical Society, vol. 119, No. 41, 1997, pp. 9909-9910.
Shi, Longqiang et al., "Synthesis, Structure, Properties, and Application of a Carbazole-Based Diaza[7]helicene in a Deep-Blue-Emitting OLED", Chemistry European Journal, vol. 18, 2012, p. 8092-8099.
Takenaka, Norito et al., "Helical Chiral Pyridine N-Oxides: A New Family of Asymmetric Catalysts", Angew. Chem. Int. Edit., vol. 47, 2008, pp. 9708-9710.
Wilson, James N. et al., "Chiroptical Properties of Poly(p-phenyleneethynylene) Copolymers in Thin Films: Large g-Values", Journal of American Chemical Society, vol. 124, No. 24, 2002, p. 6830-6831.
International Search Report and Written Opinion for PCT/GB2013/052007 dated Aug. 29, 2013.
Chen, Zhuoying et al. "High-Performance Ambipolar Diketopyrrolopyrrole-Thieno[3,2-b]thiophene Copolymer Field-Effect Transistors with Balanced Hole and Electron Mobilities", Adv. Mater., vol. 24, No. 5, 2012, p. 647-652.

(Continued)

*Primary Examiner* — Jeffrey H Murray
(74) *Attorney, Agent, or Firm* — Honigman Miller Schwartz and Cohn LLP; Andrew N. Weber; Jonathan P. O'Brien

(57) ABSTRACT

The present invention relates to compositions capable of emitting circularly polarized electroluminescence comprising an electroluminescent polymer and a chiral dopant, processes for the synthesis of such compositions and light emitting devices incorporating such compositions.

12 Claims, 6 Drawing Sheets

(56) References Cited

OTHER PUBLICATIONS

Denis, Jean-Christophe et al., "Self-trapping and excited state absorption in fluorene homo-polymer and copolymers with benzothiadiazole and tri-phenylamine", Phys. Chem. Chem. Phys., vol. 18, No. 31, 2016, p. 21937-21948.
Grell, M. et al., "Interplay of Physical Structure and Photophysics for a Liquid Crystalline Polyfluorene", Macromolecules, vol. 32, No. 18 1999, p. 5810-5817.
Kim, Ji-Seon et al. "Optoelectronic and Charge Transport Properties at Organic-Organic Semiconductor Interfaces: Comparison between Polyfluorene-Based Polymer Blend and Copolymer", J. Am. Chem. Soc., vol. 130, No. 39, 2008, p. 13120-13131.
Kreouzis, Theo et al. Hole and electron transport in poly(9,9-Dioctylfluorene) and poly (9,9-dioctylfluorene-co-benzothiadiazole) Proc. SPIE, vol. 5214, 2004, p. 141-149.
Levermore, Peter A. et al., "Organic Light-Emitting Diodes Based on Poly(9,9-dioctylfluorene-co-bithiophene) (F8T2)", Adv. Funct. Mater., Vp. 19, 2009, p. 950-957.
Zhong, Wenkai et al., "Effect of Monofluoro Substitution on the Optoelectronic Properties of Benzo[c][1,2,5] thiadiazole Based Organic Semiconductors", Macromolecules, vol. 49, No. 16, 2016, p. 5806-5816.

(a) Side-view

Top-view

F8BT

Left-handed (M or -)    Mirror plane    Right-handed (P or +)

1-Aza[6]helicene (b)

ELECTROLUMINESCENT COMPOSITIONS

The present invention relates to compositions capable of emitting circularly polarized electroluminescence comprising an electroluminescent polymer and a chiral dopant, processes for the synthesis of such compositions and light emitting devices incorporating such compositions.

BACKGROUND

Circularly polarized (CP) light emitting devices have enormous potential in a wide range of applications, including highly efficient LCD backlights, stereoscopic 3D displays, optical quantum information processing and communication. Polymer light emitting diodes (PLEDs) are devices that directly generate electroluminescence (EL) from an ultra-thin semiconducting polymer layer and have many advantages as a light source, including solution processibility, large area coverage, and flexibility. So far, attempts at generating circularly polarized electroluminescence (CP-EL) from PLEDs have involved either complex and bulky device architectures or custom synthesized non-standard polymers.

The first successful attempt to generate CP-EL directly from a PLED used a chiral-substituted poly(p-phenylene vinylene) (PPV) derivative (Peeters, E. et al. *J Am Chem Soc* 119, 9909-9910 (1997)). This initial PPV study only obtained g factors in the region of $10^{-3}$. A number of approaches have been taken to improve this very low degree of circular polarization. One approach is to dope luminescent achiral chromophores into chiral nematic or cholesteric liquid crystals (Chen, S. H. et al, *Nature* 397, 506-508 (1999) and Katsis, D., et al, *Chem Mater* 13, 643-647 (2001)). The linearly polarised emission generated becomes circularly polarised travelling through the birefringent chiral nematic film, and therefore although g factors are significantly improved from $10^{-3}$ to 0.3, the level of circular polarisation is strongly dependent on the film thickness. Indeed, a thickness in the region of several micro-meters was used, which is too thick for LEDs (usually tens to hundreds of nano-meters). Furthermore the LC host material is an insulator, which obviously limits application in such devices. The attachment of chiral side groups onto conductive polymer backbones other than PPV has also been explored in order to align them into chiral monodomain liquid crystalline film (Grell, M. and Bradley, D. C. C., *Adv. Mater,* 11, 895-905 (1999)). This technique has led to PLEDs with g factors up to 0.35, however the requirement for bespoke synthesis of a specialised polymer will likely limit its wider application. It is possible to employ wideband reflective polarizers as passive components to generate CP light in such devices, however this complicates device architecture and limits the minimum thickness achievable. The direct generation of CP light would be far more favourable in terms of energy efficiency and product cost.

SUMMARY

The disclosure herein provides an effective approach to directly generate high levels of circularly polarized electroluminescence. It has been determined that blending a helicene or other chiral small molecule with an achiral electroluminescent polymer will cause the electroluminescent polymer to preferentially emit right- or left-handed circularly polarized light. This circularly polarized light may cover the emission wavelength range of electroluminescent polymers (violet and deep blue 3G infrared) and emission may be from both singlet and triplet emitting molecular units on the main chain or side chains of the polymer.

Accordingly, in a first aspect the invention provides a composition comprising an electroluminescent polymer and a scalemic chiral dopant.

In a second aspect, the invention comprises a film comprising a composition according to the first aspect of the invention.

In a third aspect the invention provides a light emitting device comprising a composition of the first aspect of the invention or a film of the second aspect of the invention.

In a fourth aspect, the invention provides an organic electronic device comprising an active light emitting layer comprises a composition according to the first aspect of the invention or a film according to the second aspect of the invention.

In a fifth aspect, the invention provides a light emitting layer for use in an organic electronic device, the light emitting layer comprising a composition of the first aspect of the invention or a film of the second aspect of the invention.

In a sixth aspect, the invention provides a method for producing a film according to the second aspect of the invention, the method comprising applying a composition of the first aspect of the invention onto a substrate to form a film thereon.

In a seventh aspect the invention provides a method for converting an electroluminescent polymer into a polymer capable of emitting circularly polarized light, the method comprising blending the achiral electroluminescent polymer with a chiral dopant at a doping ratio of up to 55%.

BRIEF DESCRIPTION OF THE DRAWINGS

The invention may be put into practice in various ways and a number of specific embodiments will be described by way of example to illustrate the invention, with reference to the following figures, in which.

DETAILED DESCRIPTION

Figure 1:
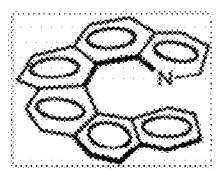
FIG. 1 shows (a) molecular structures of 1-aza[6]helicene right-handed (P or (+)) and left-handed (M or (−))enantiomers and molecular structure of the electroluminescent polymer F8BT; and (b) a single layer PLED device structure consisting of a 1-aza[6]helicene doped F8BT thin film sandwiched between a PEDOT:PSS coated ITO anode and a Ca/Al cathode; right and left-handed $\sigma^+$ and $\sigma^-$ circularly polarized electroluminescent polymer emission was respectively generated from (+)- and (−)-1-aza[6]helicene doped devices.
Figure 1:
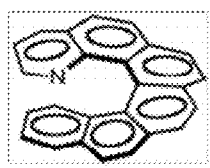
Figure 1:
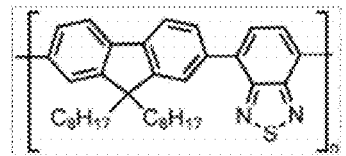
Figure 1:
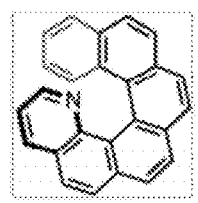
Figure 1:
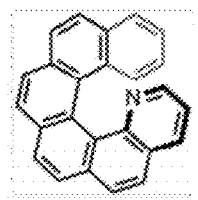
Figure 1:
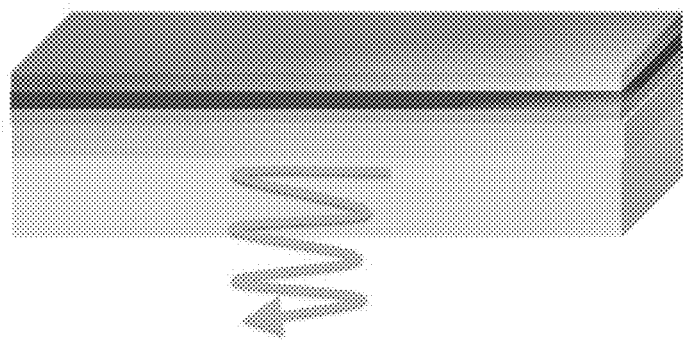

An "electroluminescent polymer" as referred to herein is polymeric material that emits light (luminescence) in response to an electric current or electric field. Examples of electroluminescent polymers include poly(arylene vinylene) derivatives, such as poly(p-phenylene vinylene)s and poly(naphthlyene vinylene)s, and polyfluorene derivatives. Poly(arylene vinylene) and polyfluorene derivatives refer to a polymer, which may be a homopolymer or copolymeric, wherein the monomeric units making up the polymeric include arylene vinylene or fluorene units, optionally amongst other monomeric units. The other monomeric units may comprise, for example, optionally substituted aromatic or heteroaromatic groups. The monomeric units within an electroluminescent polymer may optionally be substituted. A polymeric material preferably comprises at least 5, preferably at least 10, repeated monomeric units. The fluorene units may preferably be optionally substituted 2,7-linked fluorene units. In some embodiments, the fluorene units optionally comprise one or two substituents at the 9 position. The substituents may be selected from the optional substituents listed below for aromatic groups, or may preferably be —R*, —OR*, aryl(aliphatic), aryl(heteroaliphatic), heteroaryl(aliphatic), heteroaryl(heteroaliphatic).

A chiral molecule, having enantiomers (or optical isomers), may exist in the form of a racemic mixture (equal proportion of each enantiomer) or a non-racemic form. A 'scalemic' molecule is a molecule in non-racemic form. This may be a non-racemic mixture of enantiomers or an enantiopure form. Enantiopurity may be measured, for example, by chiral HPLC or by NMR with chiral shift reagents.

An achiral electroluminescent polymer is a polymer in which the polymer backbone does not have a chiral confirmation. An achiral electroluminescent polymer may be a polymer containing chiral moieties, for example within pendant side chains, but wherein any chiral moieties present do not lead to a chiral confirmation of the polymer backbone. An achiral electroluminescent polymer may alternatively be a polymer containing no chirality. An achiral electroluminescent polymer in isolation, i.e. in the absence of a chiral dopant, will not generate circularly polarised light.

A "dopant" as referred to herein is present blended together with a polymer in a mixture to form a composition of the invention. In the absence of a crosslinking reaction being carried out, a dopant is not covalently bonded to the polymer.

The 'doping ratio' is the proportion of dopant present in a composition, by weight, with reference to the electroluminescent polymer.

A 'helicene' as referred to herein is a helical polycyclic aromatic or heteroaromatic compound. Helicenes are helically shaped (and therefore chiral) conjugated molecules comprising a spiral of four or more ortho-fused aromatic or heteroaromatic rings. Helicenes can be separated into their right-handed and left-handed enantiomeric forms, for example by chiral HPLC. A helicene optionally comprises a mixture of aromatic and heteroaromatic rings. The aromatic or heteroaromatic rings of a helicene are optionally substituted.

A 'helicenoidal compound' as referred to herein is a non-fully conjugated helical polycyclic compound. A helicenoidal compound comprises fused, optionally substituted cyclic (aromatic, heteroaromatic, carbocyclic, heterocarbocyclic, or a mixture thereof) groups, but is not fully conjugated. Preferably, a helicenoidal compound comprises a spiral of 4 or more ortho-fused cyclic groups.

A 'helicene' or 'helicenoidal compound' comprises four or more optionally substituted ortho-fused cyclic groups forming a spiral configuration. Whilst there is no upper limit to the number of ortho-fused cyclic groups in a 'helicene' or 'helicenoidal compound', compounds with up to 15 fused rings are preferred. Thus, a 'helicene' or 'helicenoidal compound' is preferably a compound comprising 4 to 15 (for example 4 to 10) optionally substituted ortho-fused cyclic groups.

A 'biaryl compound' is a compound comprising two bonded aromatic or heteroaromatic groups, each of which is, independently, optionally substituted and/or fused to one or more carbocyclic or heterocyclic rings.

An "aromatic group", also referred to as an "aryl group" may be a mono-, bi- or tri-cyclic aromatic ring system, preferably a 6-14 membered ring system. A 'heteroaromatic group', also referred to as a "heteroaryl group" may be a mono-, bi- or tri-cyclic heteroaromatic ring system, in which one or more ring atoms is a heteroatom selected from O, N or S, preferably a 5-14 membered ring system.

Exemplary axially chiral biaryl compounds include BINAP (2,2'-bis(diphenylphosphino)-1,1'-binaphthyl), H8-BINAP, and BINOL (1,1'-Bi-2-naphthol).

Each instance of an aromatic, heteroaromatic, carbocyclic or heterocyclic group may, independently, optionally be substituted by one or more substituents selected from the group comprising, but not limited to halo, nitro, cyano, —R*, haloaliphatic, aryl(aliphatic), aryl(heteroaliphatic), heteroaryl(aliphatic), heteroaryl(heteroaliphatic), —OR*, —C(O)R*, —OC(O)R*, —OC(O)OR*, —C(O)OR*, —NR*$_2$, —C(O)NR*$_2$, —NR*C(O)R*, —NR*C(O)N(R*)2, —NR*CO$_2$R*, —OC(O)N(R*)$_2$, —SR*, —S(O)R*, —S(O)$_2$R*, —S(O)$_2$NR*, —C(=NR*)—N(R*)2, C(=NR*)—OR*, —N(R*)—N(R*)$_2$, —OS(O)$_2$R*, —N(R*)C(=NR*)—N(R*)$_2$, —NR*SO$_2$R*, —NR*SO$_2$N(R*)$_2$, —P(R*)$_2$, —P(O)(R*)$_2$, —P(O)(OR*)$_2$, —O—P(O)—OR*, and —P(O)(NR*)—N(R*)$_2$. In some embodiments, two adjacent substituents, taken together with intervening ring atoms, form an optionally substituted 6-membered fused aromatic ring, 5- or 6-membered fused heteroaromatic ring, or 4- to 8-membered fused carbocyclic or heterocyclic ring. Each instance of R* is, independently, hydrogen, or optionally substituted aliphatic, heteroaliphatic, aryl or heteroaryl, or wherein two R* moieties attached to the same nitrogen atom may optionally join to form a ring including the nitrogen atom. It will be understood that the substituent moieties listed above may themselves be optionally substituted, with one or more or the substituents listed above.

Optional substituents on a monomeric unit of an electroluminescent polymer may, for example, be selected from the substituents listed above.

An 'aliphatic' group is an alkyl, alkenyl or alkynyl group. The term "alkyl" includes straight-chain, branched and cyclic alkyl groups, for example having 1-20, 1-10 or 1-6 carbon atoms. The term "alkenyl" includes straight-chain, branched and cyclic alkenyl groups, for example having 2-20, 2-10 or 2-6 carbon atoms. The term "alkynyl" includes straight-chain and branched alkynyl groups, for example having 2-20, 2-10 or 2-6 carbon atoms. A "heteroaliphatic" group is an aliphatic group as defined above in which one or more carbon has been replaced with a heteroatom selected from O, S, N or P. A "carbocyclic group" is a cyclic aliphatic group, preferably 4- to 14-membered and a "heterocarbocyclic group" is a cyclic heteroaliphatic group, preferably 4- to 14-membered.

The degree of circular polarization of light obtained from a light emitting device is defined by the dissymmetry factor (g factor); the difference of the emission intensity between the right-handed polarized components $I_R$ and left-handed polarized components $I_L$ according to:

$$g = \frac{2(I_L - I_R)}{I_L + I_R}$$

In a first aspect the invention provides a composition comprising an electroluminescent polymer and a scalemic chiral dopant.

In some embodiments, the electroluminescent polymer is a polymer the electroluminescence of which, in the absence of chiral dopant, is not circularly polarized. The electroluminescent polymer is preferably an achiral electroluminescent polymer. The composition is a blend of the polymer and the dopant. A composition comprising a blend of an achiral polymer with a chiral dopant can be used to create thin films which are morphologically distinct from films prepared without dopant. Both photoluminescent and electroluminescent emission from the polymer in the presence of dopant is observed to become circularly polarized with the sign of the circularly polarized emission determined by the handedness of the chiral dopant.

In some embodiments, the chiral dopant is a helical compound, for example selected from the group consisting of, but not limited to, a helicene, a helicenoidal compound, a helical peptide and a DNA molecule. In some embodiments, the chiral dopant is 1-aza[6]helicene or 7-helicene. In other embodiments, the chiral dopant is an axially chiral biaryl compound.

In some embodiments, the chiral dopant preferably has an $M_W$ (weight average molecular weight) of up to 4000.

In some embodiments, the chiral dopant is provided at an enantiopurity of at least 30% ee, at least 40%, at least 50%, at least 60%, at least 70% ee, at least at least 80% ee, at least 90% ee, at least 95% ee or at least 99% ee.

In some embodiments, the electroluminescent polymer is a polyfluorene or poly(arylene vinylene) derivative, for example a poly(p-phenylene vinylene) derivative. In some embodiments, the electroluminescent polymer is poly[9,9-dioctylfluorene-co-benzothiadiazole].

In some embodiments, the chiral dopant is present within the composition at a doping ratio of up to 55% (by weight). The chiral dopant is preferably present at a doping ratio of 0.1 to 55%.

In some embodiments, the chiral dopant is present at a doping ratio of 0.1 to 55%, 0.1 to 35%, 0.1 to 10%, 0.1 to 8% or 0.1 to 7%. In some embodiments, the doping ratio is at least 0.5%, at least 1%, at least 2%, at least 3%, at least 4% or at least 5%.

In a second aspect, the invention provides a film comprising a composition according to the first aspect of the invention. The film may be useful as an active light emitting layer in a light emitting device, for example a polymer light emitting diode. In some embodiments, the film may be useful as a photoluminescent film or coating, which can be made to emit CP light by exposure to UV light (e.g. a UV lamp, UV LED or UV laser diode). In some embodiments, the film has a thickness of 50 to 500 nm, preferably 70 to 200 nm.

All features and embodiments of the composition of the first aspect of the invention apply to the second aspect of the invention mutatis mutandis.

In a third aspect the invention provides a light emitting device comprising a composition of the first aspect of the invention or a film of the second aspect of the invention. The light emitting device may be, for example, a light emitting device (organic or inorganic) with a coating thereon comprising a composition of the first aspect of the invention or a film of the second aspect of the invention. The light emitting device upon which the coating is applied is preferably a UV or blue light emitting device.

All features and embodiments of the composition of the first and second aspects of the invention apply to the second aspect of the invention mutatis mutandis.

In a fourth aspect, the invention provides an organic electronic device comprising an active light emitting layer comprising a composition of the first aspect of the invention or a film of the second aspect of the invention. In some embodiments, the device is a polymer light emitting diode or an organic light emitting transistor.

All features and embodiments of the composition of the first aspect of the invention apply to the fourth aspect of the invention mutatis mutandis.

In some embodiments, the device comprises an anode and a cathode, with an active light emitting layer positioned there between. The anode may be, for example, an ITO anode or a PEDOT:PSS coated ITO anode, and/or the cathode may be a Ca/Al cathode.

In a fifth aspect, the invention provides a light emitting layer for use in an organic electronic device, the light emitting layer comprising a composition of the first aspect of the invention or a film of the second aspect of the invention.

All features and embodiments of the composition of the first aspect of the invention apply to the fifth aspect of the invention mutatis mutandis.

In a sixth aspect, the invention provides a method for producing a film according to the second aspect of the invention, the method comprising applying a composition of the first aspect of the invention onto a substrate to form a film thereon. In some embodiments the step of applying is a solution processing technique where a solution comprising the composition is applied by, for example, spin coating. In some embodiments, the substrate comprises anode material, for example the substrate may be an ITO substrate or a PEDOT:PSS coated ITO substrate. In some embodiments, the method further comprises forming a cathode layer adjacent the film. The cathode layer may be formed by thermal evaporation, for example of a Ca layer capped by an Al layer.

All features and embodiments of the composition of the first aspect of the invention apply to the fifth aspect of the invention mutatis mutandis.

In a seventh aspect the invention provides a method for converting an electroluminescent polymer into a polymer capable of emitting circularly polarized light, the method comprising blending the achiral electroluminescent polymer with a chiral dopant at a doping ratio of up to 55%. All features and embodiments of the electroluminescent polymer and chiral dopant as described in respect of the first aspect of the invention apply to the seventh aspect of the invention mutatis mutandis.

The invention will now be illustrated by reference to the following non-limiting examples.

EXAMPLES

1-Aza[6]helicene and [7]-helicene were prepared as previously reported (Takenaka, N. et al, *Angew Chem Int Edit*

47, 9708-9710 (2008) and El Abed, R., et al, A. *Eur J Org Chem,* 1517-1522 (2004)) and separated using preparative chiral HPLC. Poly[9,9-dioctylfluorene-co-benzothiadiazole] (F8BT) was obtained from Sigma Aldrich. A variety of helicene concentrations were doped into 15 mg/ml F8BT solution in toluene for thin film and OLED fabrications.

Absorption and PL spectra of the blends were measured on silica substrates with Cary 300 UV-Vis spectrometer (Agilent Technologies) and FluoroMax-3 (Horiba Jobin Yvon), respectively. CP-PL spectra were collected by FluoroMax-3 together with a linear polarizer and a quarter-wave plate. The background introduced by the polarizer, wave plate and the silica substrates were examined and subtracted.

PLEDs were fabricated by spin coating 150 nm thin films of 7% 1-aza[6]helicene: F8BT blend onto PEDOT:PSS (H. C. Starck GmbH.) (50 nm) coated ITO substrates. 20 nm Ca capped by 100 nm Al layer were thermally evaporated onto the organic layer to complete the PLED structure.

JVL (current density (J), voltage (V), luminescence (L)) characterizations were performed with a Keithley 2410 and a Topcon BM-9 luminance meter. EL spectra were measured using an Ocean Optics USB 2000 charge-coupled device spectrophotometer. To record the CP-EL spectra, the Ocean Optics spectrometer were used with the same linear polarizer and quarter-wave plate as in the CP-PL measurements.

Preparation of 1-aza[6]helicene/F8BT Thin Films

Figure 2:
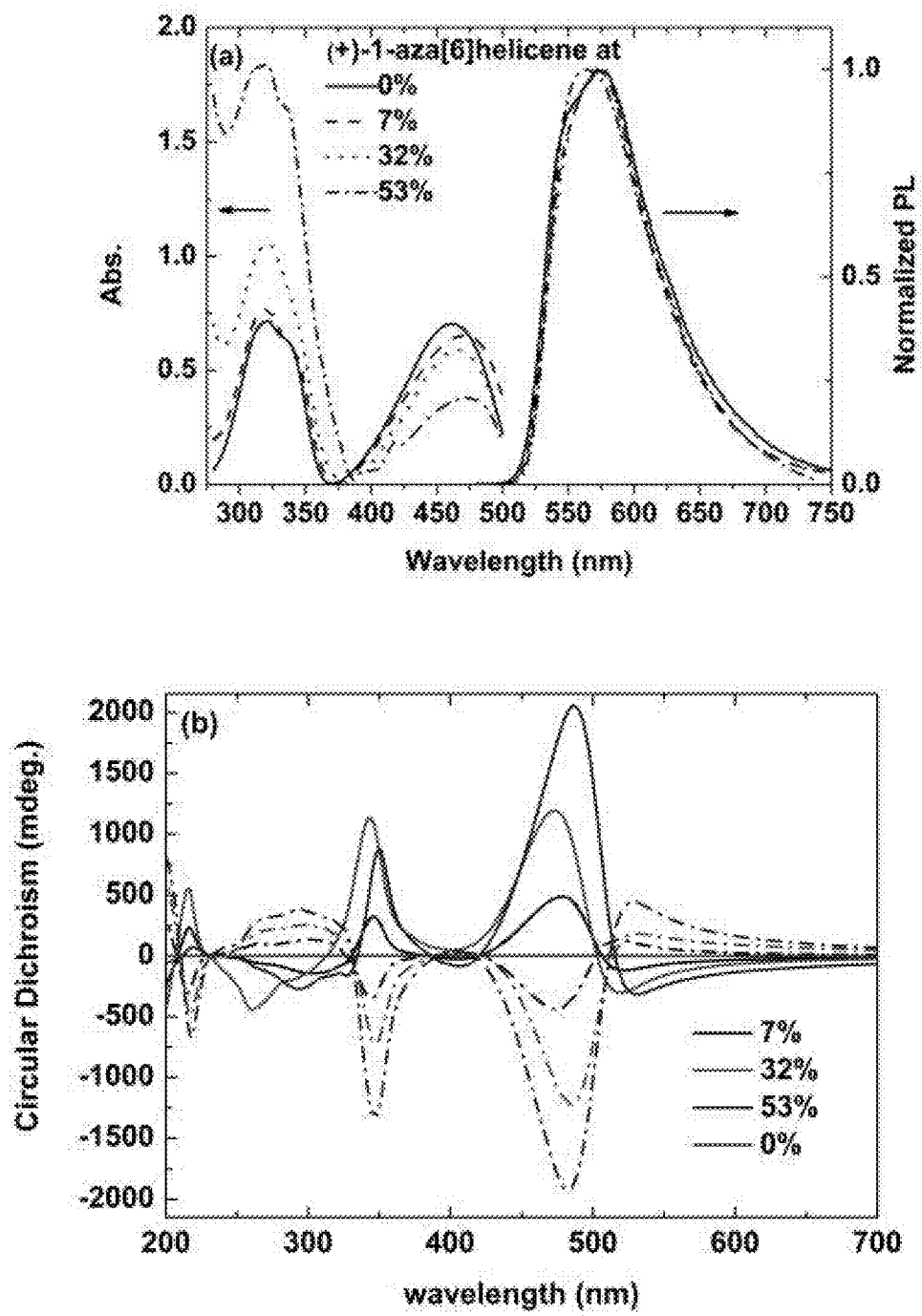
FIG. 2 shows for F8BT doped with varying ratios (0, 7, 32 and 53% by weight) of 1-aza[6]helicene: (a) absorption (solid curves) and photoluminescence (PL) (dashed curves) spectra; (b) circular dichroism (CD) spectra of F8BT doped with (+)-1-aza[6]helicene (solid curves) and (−)-1-aza[6] helicene (dashed curves); (c) circularly polarized luminescence (CP-PL) spectra of F8BT doped with (+)-1-aza[6] helicene; (d) CP-PL spectra of F8BT doped with 7% (by weight) (+)-1-aza[6]helicene (filled symbols) and 6% (−)-1-aza[6]helicene (open symbols).
Figure 2:
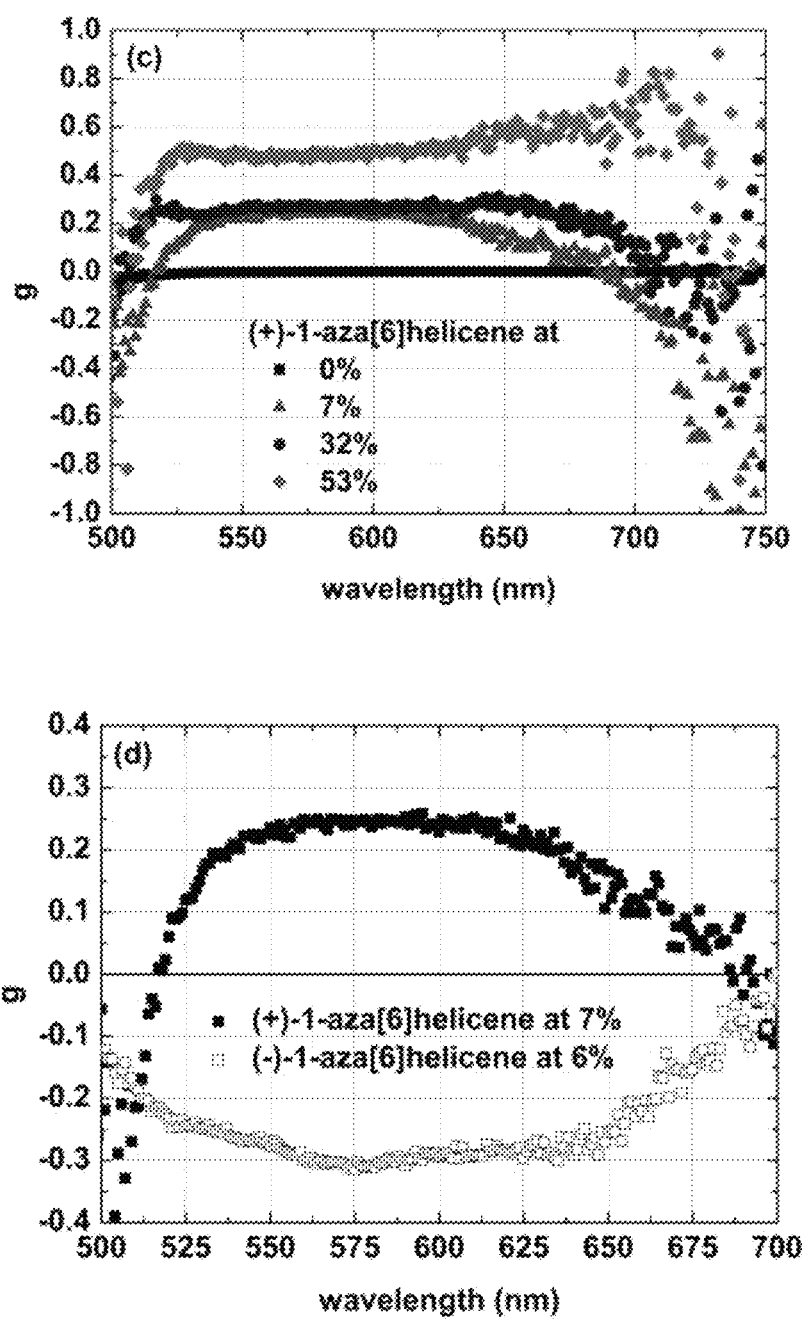

Each 1-aza[6]helicene enantiomer, was blended into the conventional and highly efficient PLED material poly[9,9-dioctylfluorene-co-benzothiadiazole] (F8BT, Sigma Aldrich, FIG. 1a). Both thin film photophysics and PLED device (FIG. 1c) performance were investigated. A variety of doping ratios up to 55% were employed to explore the impact of the helicene additive on the morphology and spectroscopic characteristics of the F8BT thin film. FIG. 2a shows the absorption and photoluminescence (PL) spectra of the (+)-1-aza[6]helicene-F8BT blend at different doping ratios. Analogous spectra were obtained when the enantiomeric (−)-1-aza[6]helicene was employed. Two absorption peaks at 325 nm and 450 nm were observed, with a gradual increase in the peak at 325 nm upon increasing amounts of helicene dopant. This increase was attributed to the strong UV absorption from 1-aza[6]helicene. The PL spectra, on the other hand, show no significant change over the range of blending ratios employed; with the emission peak representing the emission from F8BT. This is suggestive of efficient energy transfer between helicene enantiomers and F8BT and/or self-quenching of 1-aza[6]helicene. A slight decrease in the photoluminescence quantum yield (PLQY) from 45% to 30% was observed as the doping ratio increased to 55%.

To study the chiroptical properties of the thin films, circular dichroism measurements were undertaken (FIG. 2b). As would be expected, thin films of pure achiral F8BT have no CD response. Fascinatingly, when just 7% of an enantiopure 1-aza[6]helicene dopant was added, a strong CD signal (0.5 degrees) was observed around 450 nm, which by comparison with the spectra in FIG. 2a can be assigned to the absorption by F8BT. The spectra obtained for the thin films containing either the right-handed (+)-1-aza[6]helicene or the left-handed (−)-1-aza[6]helicene dopant are mirror images of each other, indicating that the sign of the CD response stems from the handedness of the chiral small molecule. The strength of the CD response increases with increasing amounts of helicene dopant, the signal reaching a value of 2 degrees at just over 50% doping ratio. Similar to the absorption spectra in FIG. 2a, another small CD peak was observed at 350 nm, which is associated with the CD response of the helicene dopant.

To demonstrate potential to generate CP light, circularly polarized PL (CP-PL) spectra were obtained and g factors calculated for the films containing increasing quantities of dopant (FIG. 2c). Unsurprisingly, no CP signal was detected from the thin film consisting of pure achiral F8BT. Incredibly however, a small amount (less than 10%) of enantiopure 1-aza[6]helicene dopant leads to a big CP response of the F8BT film, with the g value exceeding 0.2. The CP-PL spectra widely span from 520 nm to 675 nm, overlapping well with the PL spectra. This indicates that the use of chiral dopants in accordance with the invention can cover a broad wavelength range, rendering it useful with light emitting polymers which emit any colour of light (for example blue, green, orange, yellow, red, white, etc).

A further increase of the 1-aza[6]helicene doping ratio from 7% to 53% continuously results in an improvement of the g factor, up to a value of 0.5. The high g factor obtained is suggestive that the helicene dopant preorganises the polymer into a chiral, most likely helical, supramolecular structure. Importantly, as shown in FIG. 2d, the CP-PL spectra of independent blends prepared from either the left-handed (−)-1-aza[6]helicene or the right-handed (+)-1-aza[6]helicene, at the same doping ratio (7%), give equal and opposite responses. This confirms that the origin of the chiroptical response is the handedness of the helicene dopant employed.

Figure 3:
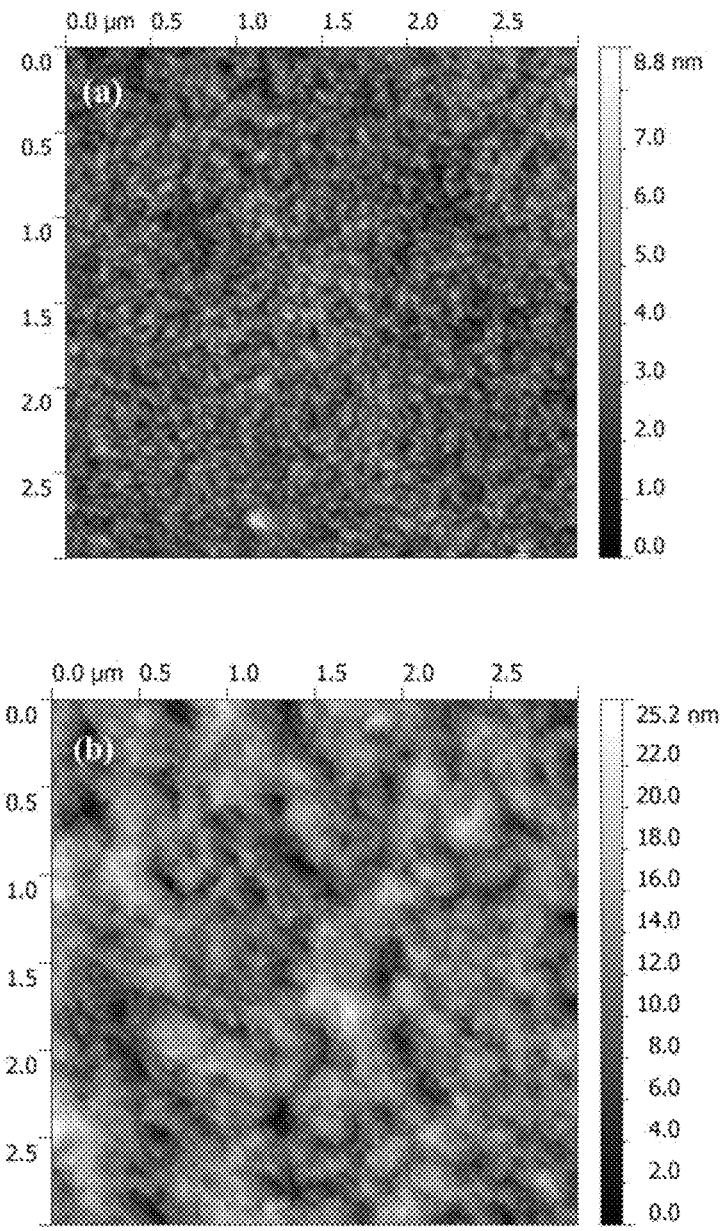
FIG. 3 shows AFM images of the F8BT: (+)-1-Aza[6] helicene blend at different ratios: (a) 0%; (b) 7%.

Atomic Force Microscopy (AFM) was carried out to study the impact of the helicene dopant on the morphology of the F8BT thin film. As shown in FIG. 3, in the absence of dopant the F8BT film is amorphous, with a surface roughness less than 5 nm. In concordance with our CP-PL results, a low doping ratio (7%) (FIG. 3b) has a significant effect on film structure. Small crystal domains are observed with sizes ranging from 50 nm to 200 nm. It is likely the higher order of these structures is responsible for the high CP emission observed. The heights of the domains are less than 20 nm, which is suitable for the fabrication of PLEDs, since such devices favour a smooth interface between the active layer and electrodes for efficient charge injection. Increasing the doping ratio beyond 7% helicene does not have as much as an effect on the gross morphology of the films, with the crystal domains of the 53% helicene blend only exhibiting a slightly modified size. The most significant change for higher blend ratios was in the domain height, which increased to 50 nm.

Preparation of PLED

Figure 4:
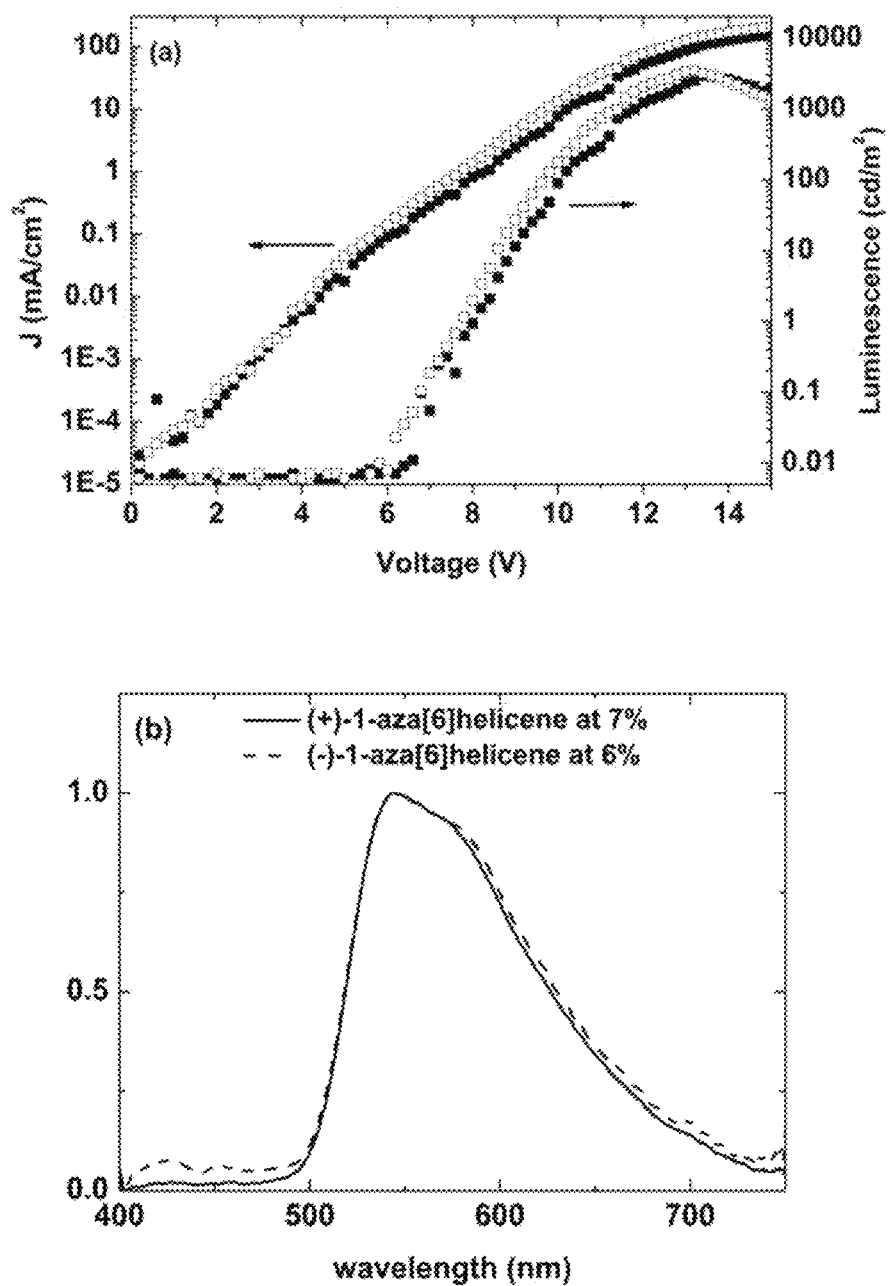
FIG. 4 shows variation of current J (circles) and luminosity L (squares) with applied voltage V; (b) EL spectra; and (c) CP-PL spectra of PLED device (see FIG. 1c) combining a light emitting layer of F8BT doped with 7% (by weight) of (+)-1-aza[6]helicene (solid squares) and 6% (by weight) (−)-1-aza[6]helicene (open squares); (d) Molecular structure of P (or +) [7]helicene; (e) CP-PL spectra of F8BT films doped with 52% (by weight) (+)- and (−)-[7]helicene.
Figure 4:
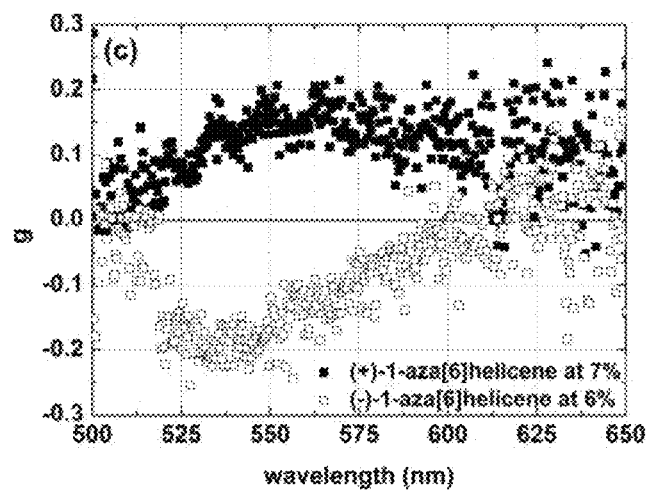
Figure 4:
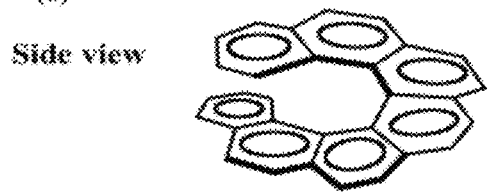
Figure 4:
Figure 4:
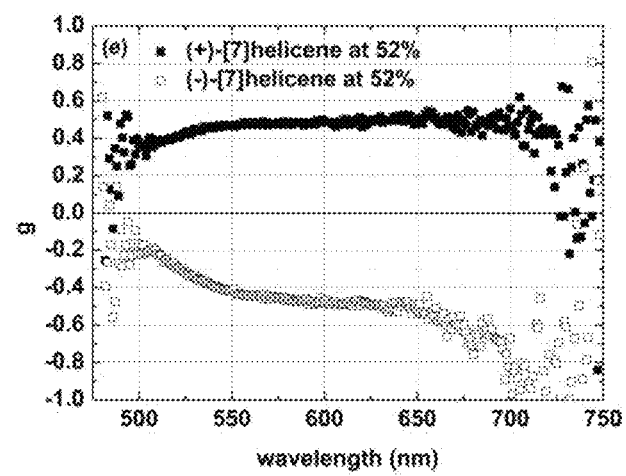

Single layer proof-of-concept PLEDs based on the F8BT blends containing 7% 1-aza[6]helicene, were fabricated with PEDOT:PSS coated ITO anodes and Ca/Al cathodes. Devices were prepared from either the left-handed (−)-1-aza[6]helicene or the right-handed (+)-1-aza[6]helicene. Typical output J-V and luminescence curves obtained for these devices are shown in FIG. 4a. A bright emission greater than 1000 cd/m$^2$ was measured under efficient charge injection for both enantiomeric devices, with an efficiency of 1.1 lm/W. The two vibronic peaks at 550 nm and 575 nm in the EL spectrum (FIG. 4b) correspond to the emission observed in the PL spectra (FIG. 2a). The CP-EL spectra obtained from the two enantiomeric devices are shown in FIG. 4c. The CP-EL spectra resemble the profiles of the CP-PL spectra (FIG. 2c) and are equal and opposite depending on the enantiomer of the helicene used. A g factor as high as 0.2 was observed, which also corresponds well to that obtained for CP-PL. Indeed, this CP-EL value is competitive with other reported CP-PLED devices.

Blend with [7]-helicene

A thin film blend of F8BT was prepared with enantiopure [7]-helicene (FIG. 4d). The CP-PL spectra from the 52% [7]-helicene-F8BT blend, shown in FIG. 4e, were comparable to those obtained with 1-aza[6]helicene at an analogous blending ratio (53%, see FIG. 2), with g factors up to 0.5.

Various modifications may be made to the embodiments described without departing from the scope of the invention as defined by the accompanying claims.

The invention claimed is:

1. A composition comprising an electroluminescent polymer and a scalemic chiral dopant.

2. The composition of claim 1, wherein the chiral dopant is a helical compound.

3. The composition of claim 1, wherein the chiral dopant is a helicene, a helicenoidal compound, a helical peptide or a DNA molecule.

4. The composition of claim 1, wherein the chiral dopant is an axially chiral biaryl compound.

5. The composition of claim 1, wherein the chiral dopant is 1-aza[6]helicene or 7-helicene.

6. The composition of claim 1, wherein the chiral dopant has a $M_W$ of up to 4000.

7. The composition of claim 1, wherein the electroluminescent polymer is a polymer, the electroluminescence of which in the absence of chiral dopant is not circularly polarized.

8. The composition of claim 1, wherein the electroluminescent polymer is an achiral electroluminescent polymer.

9. The composition of claim 1, wherein the electroluminescent polymer is a polyfluorene or poly(p-phenylene vinylene) derivative.

10. The composition of claim 9, wherein the electroluminescent polymer is poly[9,9-dioctylfluorene-co-benzothiadiazole].

11. The composition of claim 1, wherein the chiral dopant is present within the composition at a doping ratio of up to 55% (by weight).

12. The composition of claim 11, wherein the chiral dopant is present at a doping ratio of 0.1 to 55%.

* * * * *